United States Patent
Kariyazaki et al.

(10) Patent No.: US 6,723,627 B1
(45) Date of Patent: Apr. 20, 2004

(54) METHOD FOR MANUFACTURING SEMICONDUCTOR DEVICES

(75) Inventors: Syuuichi Kariyazaki, Tokyo (JP); Hirokazu Honda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/677,984

(22) Filed: Oct. 3, 2000

(30) Foreign Application Priority Data

Oct. 8, 1999 (JP) .......................................... 11-287752

(51) Int. Cl.[7] .............................................. H01L 21/44
(52) U.S. Cl. ...................................... 438/612; 438/613
(58) Field of Search .............................. 438/106, 612, 438/613, 615, 617, 616, 977, FOR 343, FOR 485; 257/772, 780, 784, 789, 791, 793

(56) References Cited

U.S. PATENT DOCUMENTS

| | | | |
|---|---|---|---|
| 5,274,913 A | * 1/1994 | Grebe et al. | 228/119 |
| 5,428,249 A | * 6/1995 | Sawayama et al. | 257/746 |
| 5,956,605 A | * 9/1999 | Akram et al. | 228/180.22 |
| 5,970,319 A | * 10/1999 | Banks et al. | 438/108 |
| 6,008,071 A | * 12/1999 | Karasawa et al. | 485/115 |
| 6,062,460 A | * 5/2000 | Sato | 228/119 |
| 6,100,496 A | * 8/2000 | Takuya et al. | 219/121.59 |
| 6,121,689 A | * 9/2000 | Capote et al. | 257/773 |
| 6,297,560 B1 | * 10/2001 | Capote et al. | 257/701 |

FOREIGN PATENT DOCUMENTS

| | | | | |
|---|---|---|---|---|
| JP | 62039043 A | * | 2/1987 | H01L/23/48 |
| JP | 04236435 | * | 8/1992 | H01L/21/60 |
| JP | 05-152378 | | 6/1993 | |
| JP | 08-139129 | | 5/1996 | |
| JP | 09-092682 | | 4/1997 | |
| JP | 09-092685 | | 4/1997 | |
| JP | 09-162214 | | 6/1997 | |
| JP | 09-251971 | | 9/1997 | |
| JP | 10-050770 | | 2/1998 | |
| JP | 10-340977 | | 12/1998 | |
| JP | 11-026511 | | 1/1999 | |

* cited by examiner

Primary Examiner—W. David Coleman
Assistant Examiner—Brook Kebede
(74) Attorney, Agent, or Firm—Michael Best & Friedrich LLP

(57) ABSTRACT

There is provided a method for manufacturing semiconductor devices includes the steps of: packaging onto a wiring board a semiconductor chip that flux is coated to its right face onto which ball-like solder electrodes are connected; forcedly spraying a washing solution to an under-fill portion between the semiconductor chip and the wiring board, to wash off the flux; and exposing the wiring board to an oxygen-plasma atmosphere to conduct plasma processing on the wiring board.

13 Claims, 9 Drawing Sheets

2; ball-like solder electrode

1; semiconductor chip

3; flux

4; eutectic solder bump

5; wiring board

52; ball-like solder electrodes

51; semiconductor chip

53; flux

54; eutectic solder bump

55; wiring board

METHOD FOR MANUFACTURING SEMICONDUCTOR DEVICES

BACKGROUND OF THE INVENTION

1. Field of the Invention

The invention relates to a method for manufacturing semiconductor devices and, more particularly, to the method for manufacturing semiconductor devices by packaging a semiconductor chip onto a wiring board by use of a flip-chip approach.

2. Description of the Related Art

To manufacture a semiconductor device represented by an LSI (Large Scale Integration) such as a microprocessor, a memory, or a like, it is necessary to package onto a wiring board a semiconductor chip in which desired circuits are incorporated. To thus package the semiconductor chip, there have been known the following two approaches conventionally.

One approach is a face-up approach, whereby the semiconductor chip is packaged onto a wiring board with its right face facing upward on which pads are formed electrodes. According to this face-up approach, pad electrodes of the semiconductor chip are bonded with a wire to their corresponding wiring portions on the wiring board, thus being connected to an outside of the semiconductor chip. An other approach is a face-down approach, whereby the semiconductor chip is packaged onto the wiring board with its right face facing downward on which its pad electrodes are formed, an outgrowth of which approach is known as a flip-chip approach using ball-like solder electrodes (solder bumps) for connection. According to this approach, the ball-like solder electrode is formed at each pad of the semiconductor chip and connected to its corresponding wiring portion on the wiring board, thus being connected to the outside of the semiconductor chip.

As can be appreciated from comparison between the above-mentioned two approaches of packaging, the flip-chip approach eliminates a process of wire bonding and, moreover, is advantageously capable of connecting a number of ball-like solder electrodes to the wiring board simultaneously, thus tending to be employed preferably in manufacturing of LSIs having an ever increasing number of pins with increasing integration densities and functions required.

The following will describe the above-mentioned method of manufacturing semiconductor devices with reference to FIGS. 7A, 7B, 7C, 8A, 8B, 9A and 9B.

First, as shown in FIG. 7A, a semiconductor chip 51 is prepared in which a number of ball-like solder electrodes 52 made of high-melting-point solder are connected onto a right face of the semiconductor chip 51. Next, as shown in FIG. 7B, flux 53 is coated, to improve solderability, to the right face of the semiconductor chip 51 on which the ball-like solder electrodes 52 are formed. This flux 53 coating is performed by immersing that right face of the semiconductor chip 51 in for example a flux tub filled with flux 53. Next, as shown in FIG. 7C, a wiring board 55 is prepared which includes a multi-layer wiring board and a number of eutectic solder bumps 54 connected thereto, so that on this wiring board 55 is mounted the semiconductor chip 51 in such a manner that its ball-like solder electrodes 52 may be aligned with corresponding eutectic solder bumps 54 and then, as shown in FIG. 8A, the eutectic solder bumps 54 are melted, thus packaging the semiconductor chip 51 to the wiring board 55 (primary packaging). This semiconductor-chip packaging process is performed by moving the wiring board 55 mounted with the semiconductor chip 51 as mentioned above, into a solder reflow furnace.

Next, to remove residual flux remaining on the right face of the semiconductor chip 51 or that of the wiring board 55, it is washed to remove the flux. This flux removal by washing has been conventionally performed specifically by immersing the wiring board 55 as mounted with the semiconductor chip 51 thereon into a washing tub and by applying supersonic waves to a washing solution. Next, as shown in FIG. 8B, a resin is injected to an under-fill portion 56 sandwiched between the semiconductor chip 51 and the wiring board 55, which is followed by a cure process to harden the resin, thus forming an under-fill resin 57. By the above steps, a main portion of the semiconductor device is manufactured.

Next, as shown in FIG. 9A, a radiation plate 58 is attached to a back face of the semiconductor chip 51 and then, as shown in FIG. 9B, ball-like solder electrodes 59 for use in secondary packaging are connected onto a back face of the wiring board 55, thus completing the semiconductor device.

The conventional method for manufacturing semiconductor devices, however, has a problem in that a process of flux removal by washing performed after a semiconductor chip 51 is mounted onto a wiring board 55 is not capable of completely removing the flux, thus leaving residual flux.

That is, as mentioned above, even when the wiring board 55 mounted with the semiconductor chip 51 thereon is immersed into the washing tub and washed therein, the flux cannot completely be removed, to leave part of its organic film on the right face of the semiconductor chip 51 or that of the wiring board 55, thus generating flux residue. This may be because a distance between the ball-like solder electrodes 52 of the semiconductor chip 51 is extremely small and, at a same time, distance between the semiconductor chip 51 and the wiring board 55 is also small, thus suppressing full exertion of stirring effects by the supersonic wave in the washing solution. Such flux residue may be formed increasingly, taking into account that the distance between the ball-like solder electrodes 52 will be smaller with an ever increasing number of pins of a future LSI.

Although such a conventional method has been worked out that employs, instead of the supersonic-wave approach, a shower approach for spraying a washing solution to the under-fill portion 56 to wash off the flux, this shower approach cannot avoid the above-mentioned disadvantage either because it also finds it difficult to permit the washing solution to go sufficiently around an extremely small area between the ball-like solder electrodes 52 as well as narrow under-fill portion 56 sandwiched between the semiconductor chip 51 and the wiring board 55.

As mentioned above, if the flux residue is generated, the following process of injecting a resin to the under-fill portion 56 suffers from a poor flowability of the resin. That is, the flowability of the resin degrades because flow of the resin is inhibited by action of the organic film of the flux left on the right face of the semiconductor chip 51 or that of the wiring board 55. Therefore, the resin cannot completely be injected to the under-fill portion 56, thus always giving rise to a void in the under-fill resin 57 when it is being injected. The void thus generated in the under-fill resin 57 may contribute to a poor continuity between the semiconductor chip 51 and the ball-like solder electrodes 52 when a completed semiconductor device is packaged onto a mother board of an electronic apparatus (secondary packaging).

As shown in FIG. 10A, a void 60, if generated in the under-fill resin 57 when the resin is injected, may expand over melted ball-like solder electrodes 52, as shown in FIG. 10B, because of heat treatment conducted when the semiconductor device is secondary-packaged to the mother board, to deform mutually adjacent ball-like solder electrodes 52, thus resulting in short-circuiting therebetween.

Also, poor flowability, due to occurrence of the flux residue, of the resin during a process of injecting the resin to the under-fill portion 56 brings about longer time required for resin injection, thus affecting manufacturing costs.

SUMMARY OF THE INVENTION

In view of the above, it is an object of the invention to provide such a method for manufacturing a semiconductor device that improves flowability of a resin when it is injected to an under-fill portion, thus preventing a void from occurring in an under-fill resin during a resin injection process and also shortening a time required for that process.

According to an aspect of the present invention, there is provided a method for manufacturing semiconductor devices for packaging a semiconductor chip onto a wiring board by a flip-chip approach and then injecting a resin to an under-fill portion between the wiring board and the semiconductor chip, including the steps of:

preparing, as a flux-coating step, the semiconductor chip onto a right face of which are connected ball-like solder electrodes and then coating flux onto the right face of the semiconductor chip;

preparing, as a semiconductor-chip packaging step, the wiring board onto a right face of which are connected eutectic solder bumps and mounting the semiconductor chip onto the wiring board in such a way that the ball-like solder electrodes may be aligned with the eutectic solder bumps and then melting the eutectic solder bumps, to thereby package the semiconductor chip onto the wiring board;

forcedly spraying, as a flux wash-off step, a washing solution to the under-fill portion, to wash off the flux coated to the under-fill portion;

exposing, as a plasma processing step, to a plasma atmosphere the wiring board mounted with the semiconductor chip thereon, to subject the wiring board to plasma processing; and injecting the resin to the under-fill portion as an under-fill resin-injection process.

In the foregoing, a preferable mode is one that wherein further including the step of, after the under-fill resin-injection process, a packaging ball-like solder electrode-connection step of connecting packaging ball-like solder electrodes onto a back face of the wiring board.

Also, a preferable mode is one that wherein further including step of a radiation-plate mounting process of mounting a radiation plate onto a back face of the semiconductor chip after the under-fill resin-injection process and before the packaging ball-like solder electrode-connection step.

Also, a preferable mode is one wherein the plasma processing step is specifically performed by performing plasma processing by use of oxygen, argon, or a gas mixture of oxygen and argon.

Also, a preferable mode is one wherein a melting point of the ball-like solder electrodes of the semiconductor chip is higher than a melting point of the eutectic solder bumps of the wiring board.

Also, a preferable mode is one wherein the ball-like solder electrodes of the semiconductor chip are made of solder having a high melting point.

Also, a preferable mode is one wherein the packaging ball-like solder electrodes of the wiring board are made of eutectic solder.

Also, a preferable mode is one wherein a region where the ball-like solder electrodes are not connected onto the right face of the semiconductor chip is covered with an insulator protection film.

Furthermore, a preferable mode is one wherein a region where the eutectic solder bumps are not formed on the right face of the wiring board is covered with an insulator protection film.

Still furthermore, a preferable mode is one wherein the wiring board makes up of a multi-layer wiring board.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Best modes of carrying out the present invention will be described in further detail using various embodiments with reference to the accompanying drawings.

First Embodiment

The following will describe a method for manufacturing semiconductor devices following steps with reference to FIGS. 1A to 1C, 2A to 2C, 3A to 3C, 4A and 4B.

Figure 1A:
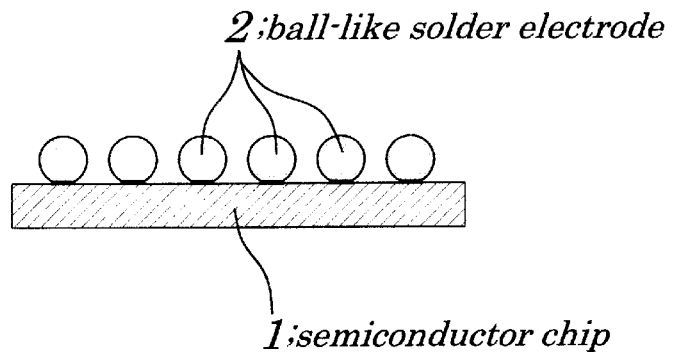
FIGS. 1A to 1C are flow diagrams showing, in a step-wise order, a configuration of a semiconductor-device manufacturing method according to a first embodiment of the invention.
Figure 5:
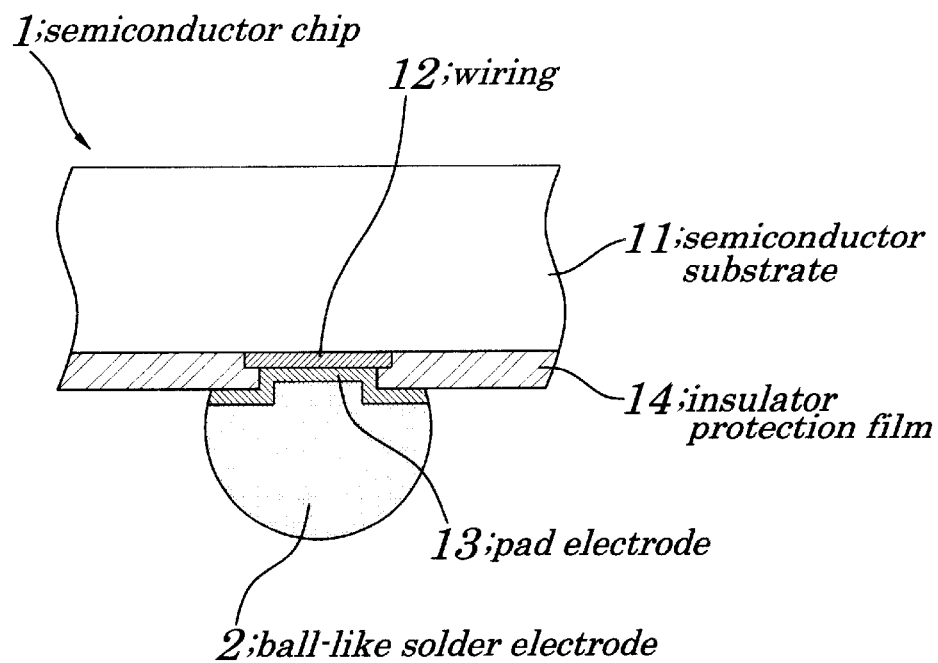
FIG. 5 is a cross-sectional view showing an outline of a semiconductor chip used by the same semiconductor-device manufacturing method.

First, as shown in FIG. 1A, a semiconductor chip 1 is prepared on a right face of which are connected a number of ball-like solder electrodes 2 made of high-melting-point solder. As this high-melting-point solder, for example, an alloy of Pb (lead) and Sn (tin) is used which has a composition ratio of 75% of Pb and 25% of Sn and a melting point of 270–280° C. From the semiconductor chip 1, as shown in FIG. 5, is pulled out a wiring 12 made of aluminum or a like connected, in configuration, to a semiconductor region formed in a surface of the right face of a semiconductor substrate 11, on which wiring 12 is formed a pad electrode 13 made of copper or a like, to which is connected such ball-like solder electrodes 2 as mentioned above. Also, an insulator protection film 14 made of an oxide film or a like is formed in a region where the ball-like solder electrodes 2 are not connected onto the right face of the semiconductor chip 1.

Figure 1B:
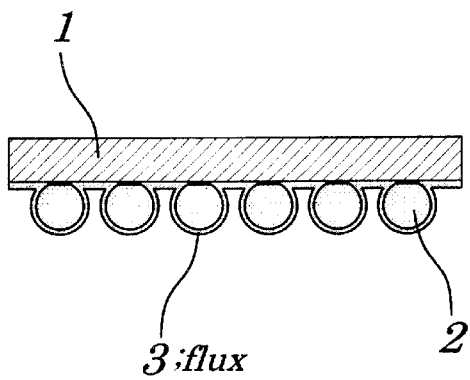

Next, as shown in FIG. 1B, flux 3 is coated to the right face including the ball-like solder electrodes 2 of the semiconductor chip 1. The flux 3 is coated specifically by immersing the right face of the semiconductor chip 1 in, for example, a flux tub filled with the flux 3.

Figure 1C:
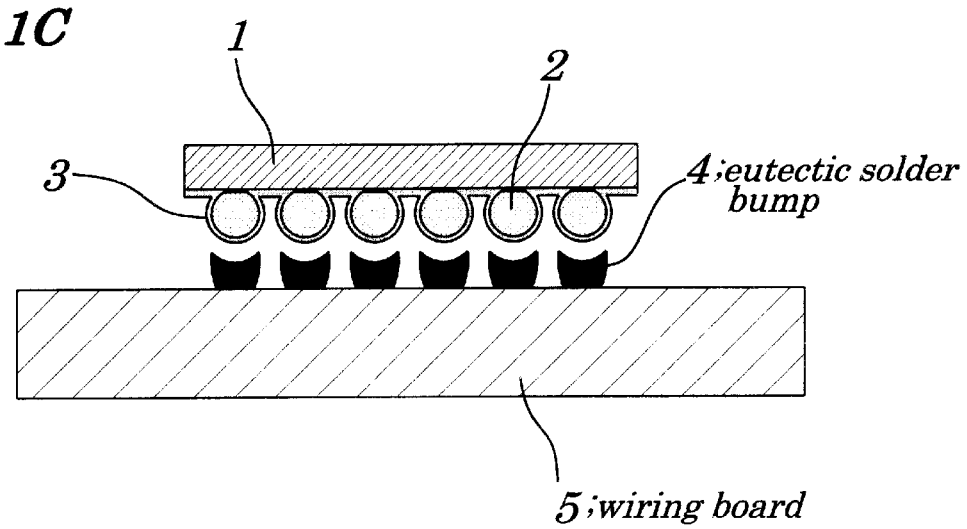

Next, as shown in FIG. 1C, a wiring board 5 is prepared to a right face of which are connected a number of eutectic solder bumps 4 having a composition ratio of 37% of Pb and 63% of Sn and a melting point of 183° C. This wiring board 5 should have a multi-layer wiring structure made of, for example, an epoxy resin or a like. An insulator protection film (not shown) made of an oxide film is formed in a region where the eutectic solder bumps 4 are not connected onto the right face of the wiring board 5. Next, the semiconductor chip 1 is mounted on the wiring board 5 in such a manner that the ball-like solder electrodes 2 of the semiconductor chip 1 may be aligned with the eutectic solder bumps 4.

Figure 2A:
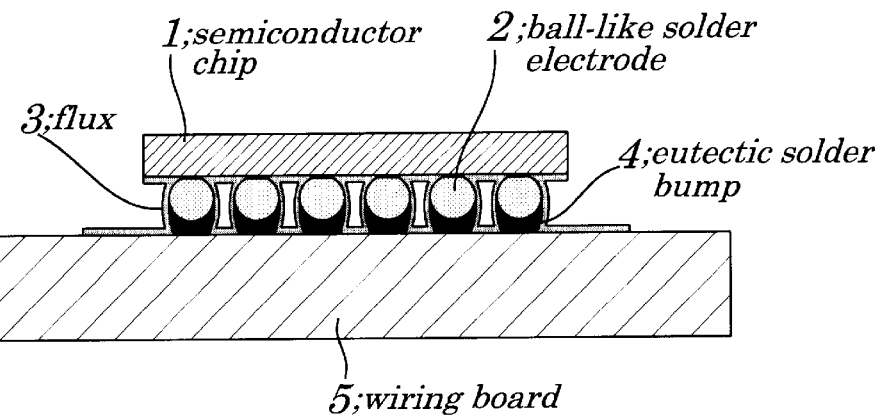
FIGS. 2A to 2C are continuing flow diagrams showing a same semiconductor-device manufacturing-method configuration in an order of the steps performed.
Figure 6:
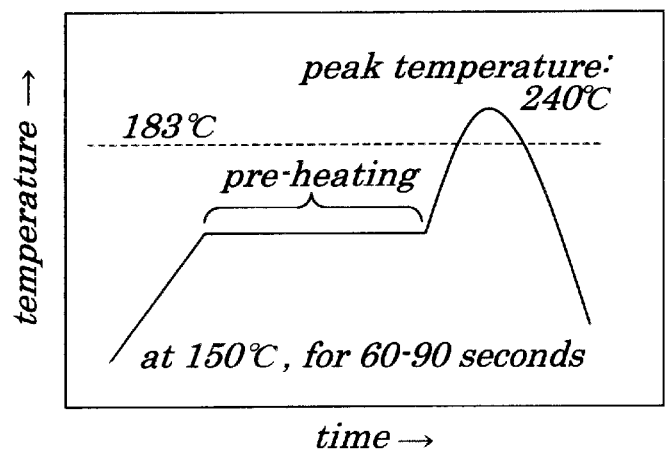
FIG. 6 is a graph indicating one example of a temperature profile during a semiconductor-chip packaging process by the same semiconductor-device manufacturing method.
Figure 7A:
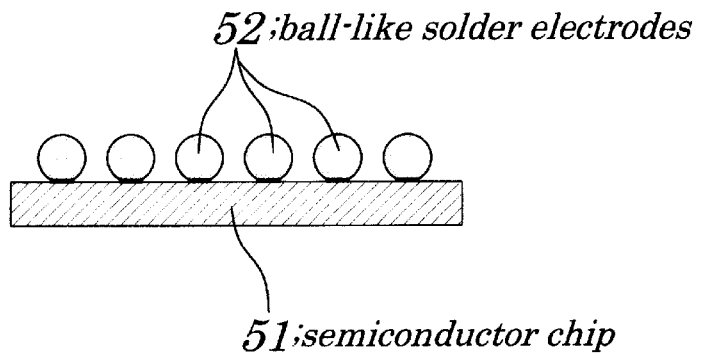
FIGS. 7A to 7C are flow diagrams showing, in a step-wise order, a configuration of a prior-art method for manufacturing semiconductor devices.
Figure 7B:
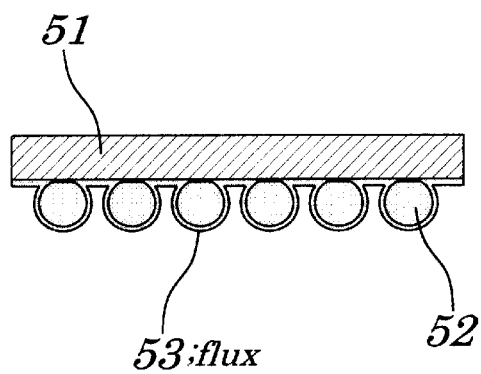
Figure 7C:
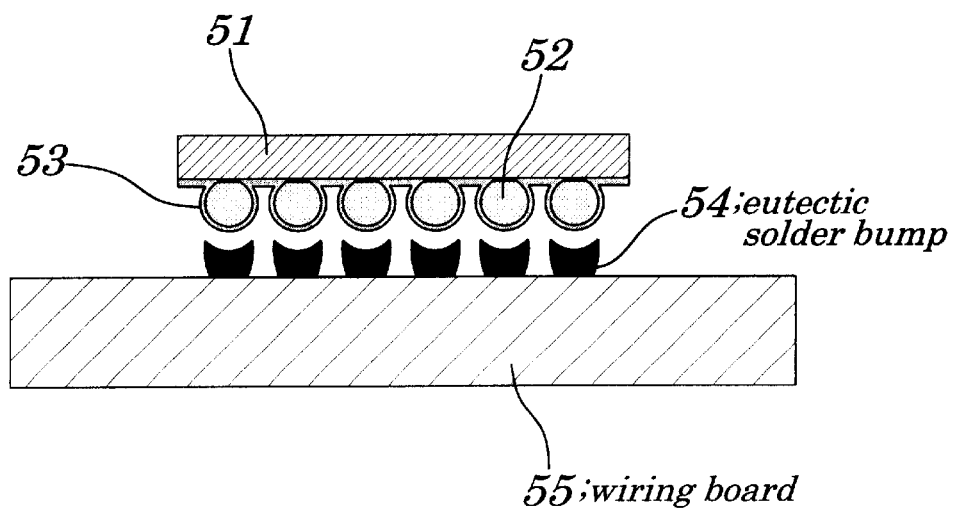
Figure 8A:
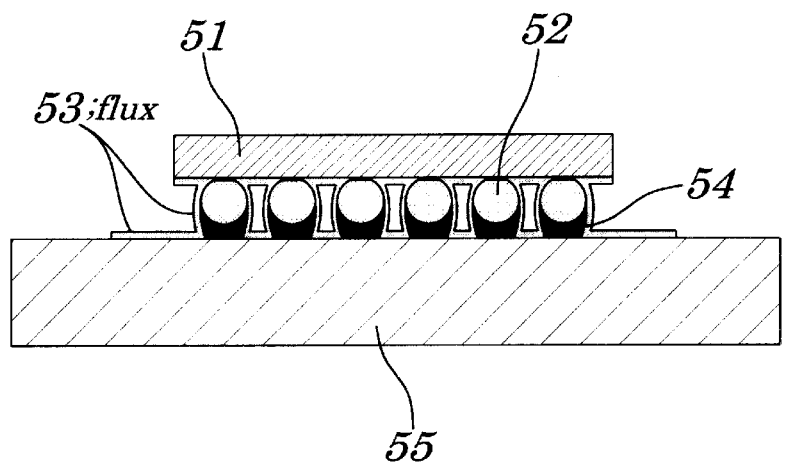
FIGS. 8A and 8B are continuing flow diagrams for showing a same prior-art semiconductor-device manufacturing-method configuration in an order of the steps performed.
Figure 8B:
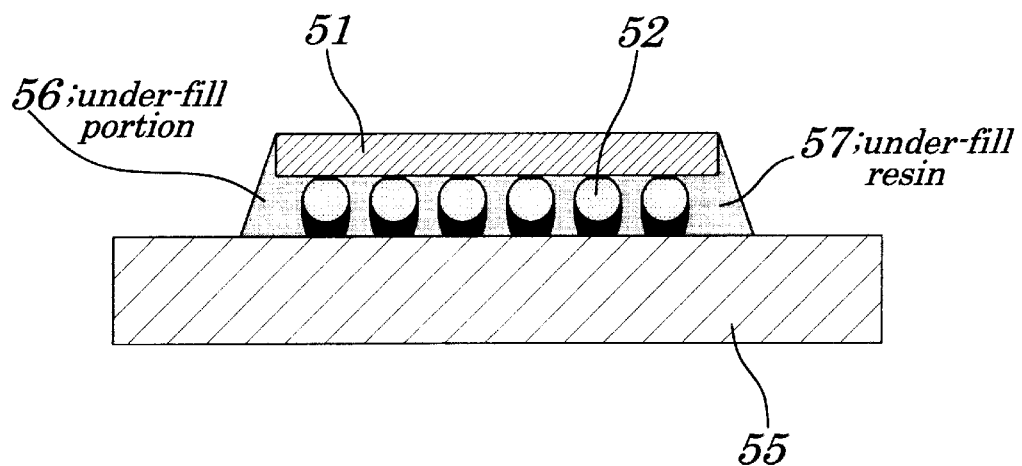
Figure 9A:
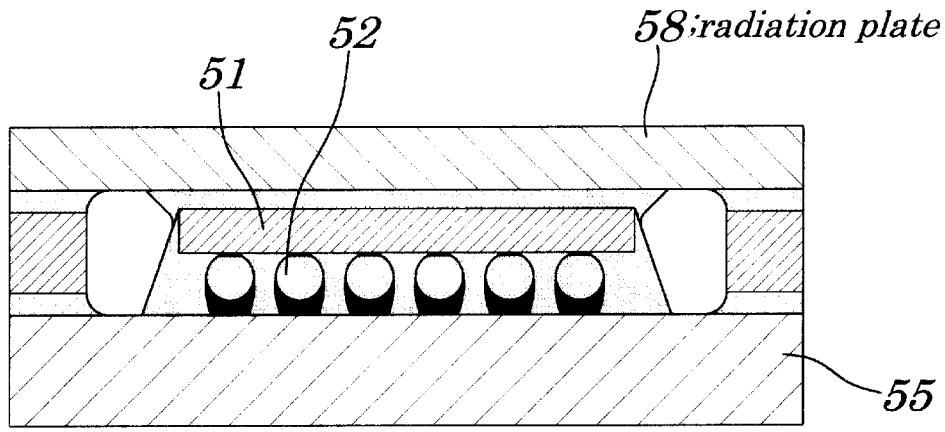
FIGS. 9A and 9B are another continuing flow diagrams showing the same prior-art semiconductor-device manufacturing-method configuration in the order of the steps performed.
Figure 9B:
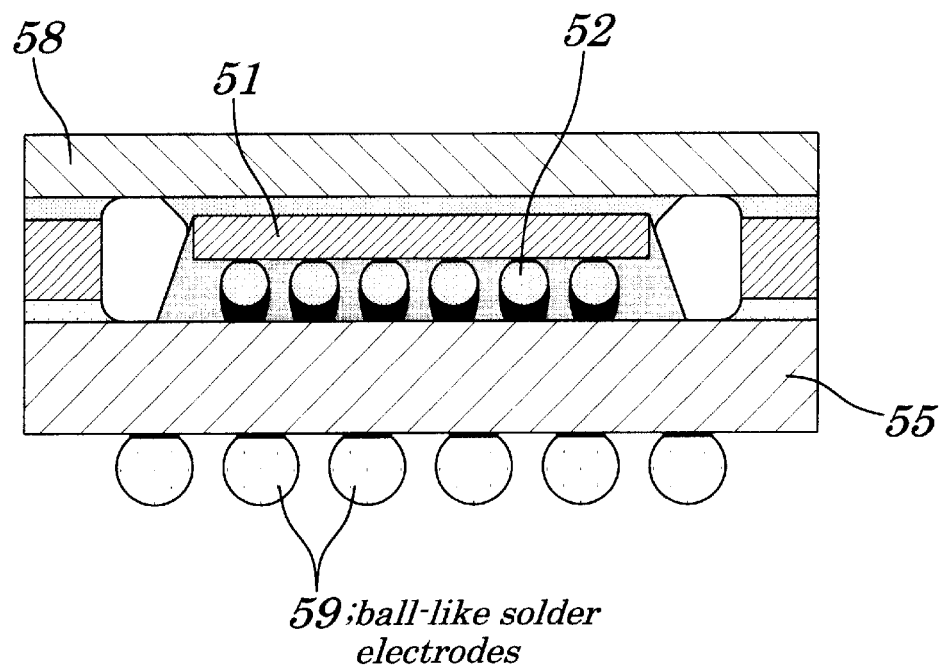
Figure 10A:
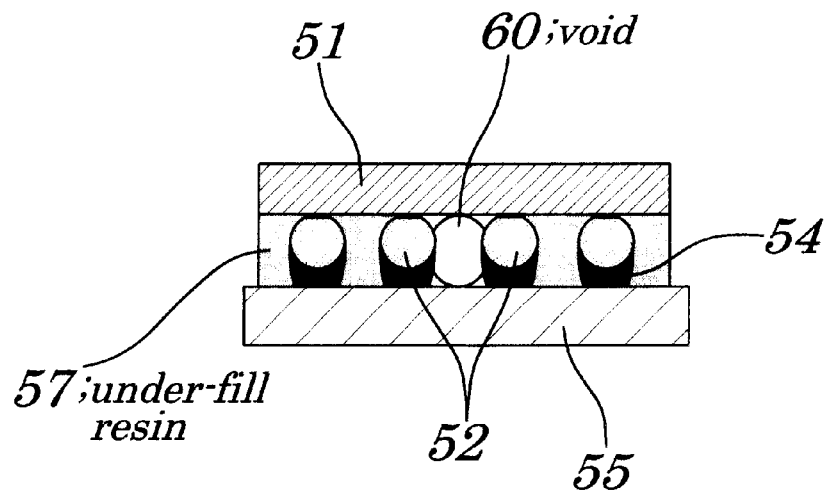
FIGS. 10A and 10B show a disadvantage of the same prior-art semiconductor-device manufacturing method.
Figure 10B:
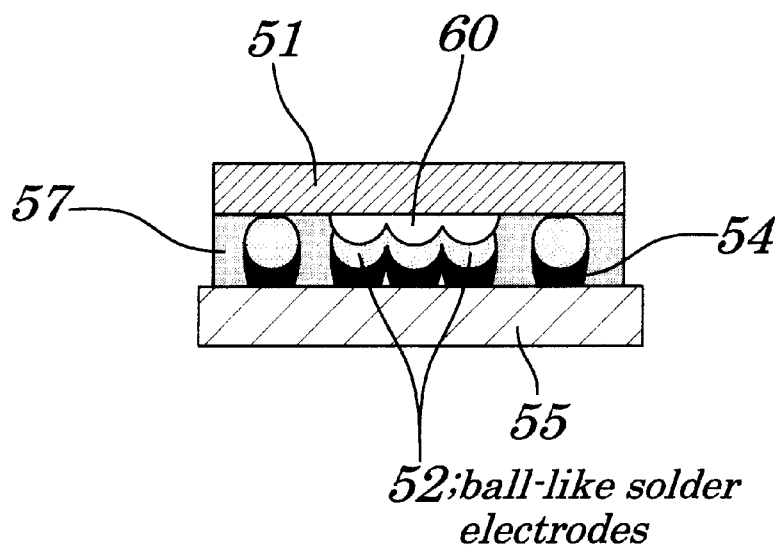

Next, as shown in FIG. 2A, the wiring board 5 mounted with the semiconductor chip 1 thereon is moved into a reflow furnace to melt the eutectic solder bumps 4 by infrared heating, thus packaging the semiconductor chip 1 onto the wiring board 5 (primary packaging). As can be seen from FIG. 6, when preheated and then heated up to the melting point of the eutectic solder bumps 4 (183° C.) or higher, the eutectic solder pumps 4 start to melt and, at a peak temperature of about 240° C., are melted completely. Note here that this peak temperature of reflow processing is not higher than the melting point (270–280° C.) of high-melting-point solder which the ball-like solder electrodes 2 of the semiconductor chip 1 are made of, so that the ball-like solder electrodes 2 do not melt when the semiconductor chip 1 is packaged.

Figure 2B:
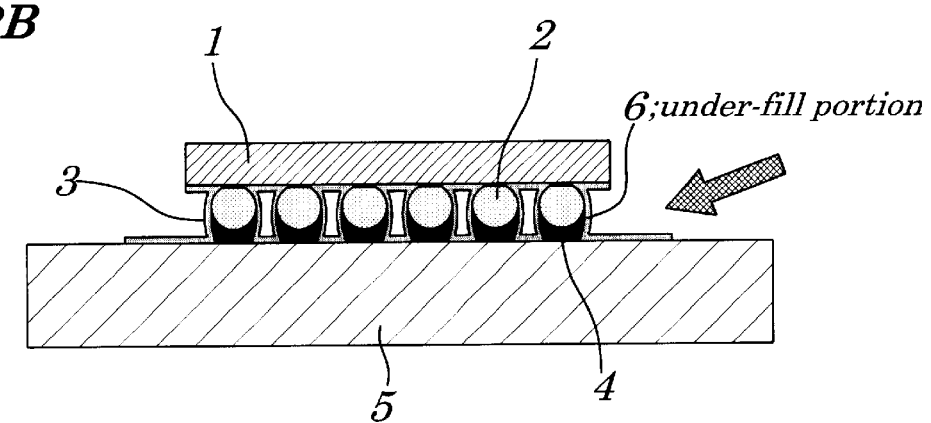

Next, the right face of the semiconductor chip 1 or that of the wiring board 5 is washed to remove the flux 3 left thereon. This flux wash-off process is performed specifically, as shown in FIG. 2B, by spraying a washing solution in an arrow direction by a forced water-flowing method to an under-fill portion 6 between the semiconductor chip 1 and the wiring board 5. By thus spraying washing solution to the under-fill portion 6 forcedly, the washing solution can go sufficiently around a minute region between the ball-like solder electrodes 2 and a narrow region of the under-fill portion 6 between the semiconductor chip 1 and the wiring board 5. Thus, an organic film of the flux 3 can be removed almost completely.

Figure 2C:
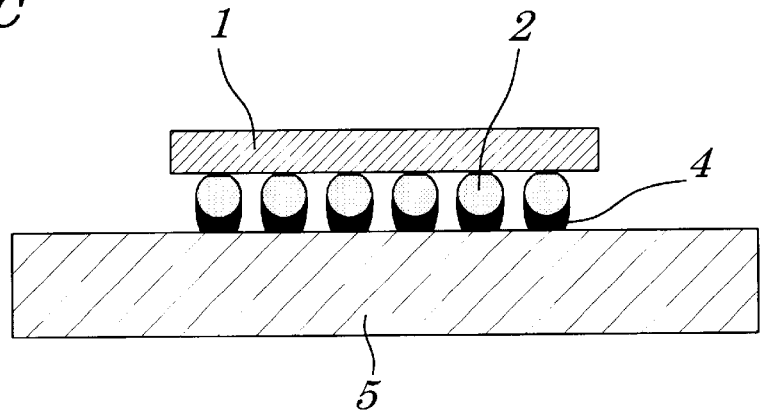

Next, as shown in FIG. 2C, the wiring board 5 mounted with the semiconductor chip 1 thereon is exposed to a nitrogen-containing atmosphere to undergo bake processing at about 120° C. for two to four hours. This bake processing causes water contents to evaporate which were produced at least onto the right face of the semiconductor device 1 or that of the wiring board 5 during a preceding flux wash-off process.

Figure 3A:
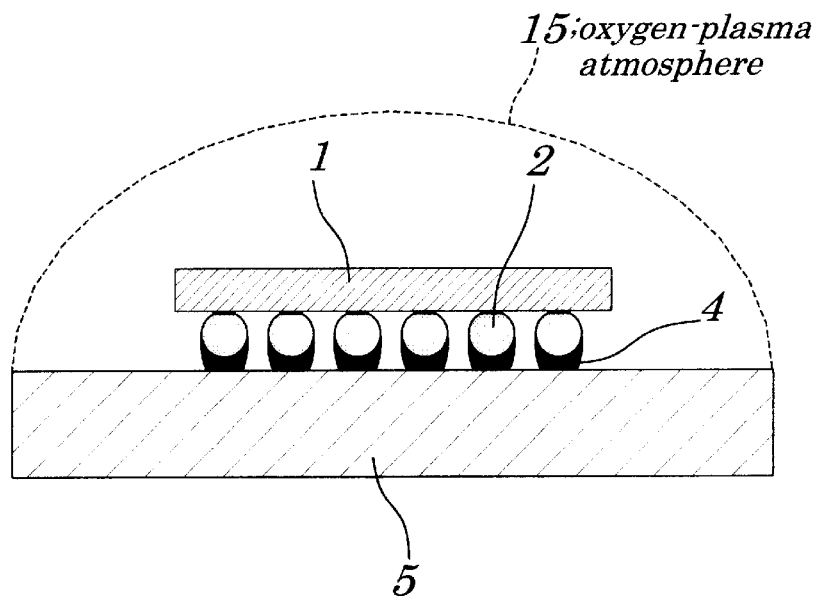
FIGS. 3A to 3C are another continuing flow diagrams showing the same semiconductor-device manufacturing-method configuration in the order of the steps performed.

Next, as shown in FIG. 3A, the wiring board 5 mounted with the semiconductor chip 1 thereon is exposed to an oxygen-plasma atmosphere 15 to perform plasma processing. This plasma processing is performed at a room temperature, at power of 600W, and at a pressure of 80–85 Pa (Pascal) for about 12 minutes. This oxygen-plasma processing roughens the right face of the semiconductor chip 1 and that of the wiring board 5, thus forming minute irregularities. Therefore, by physical and chemical etching actions by the oxygen-plasma atmosphere 15, the organic film of the flux 3 left in the above-mentioned flux wash-off can be removed completely.

Also, as mentioned above, the organic film stuck onto the right face of the semiconductor chip 1 and that of the wiring board 5 can thus be removed, to improve the flowability of the resin when it is injected to the under-fill portion 6 subsequently. Therefore, a void is prevented from being generated in an under-fill resin 7 when the resin is being injected. Moreover, improvements in the flowability of the resin lead to reduction in time required to inject the resin. Further, plasma processing by use of oxygen, in particular, causes an oxygen molecule having a higher polarity to stick onto the above-mentioned right face, to exert chemical coating action by this oxygen molecule, thus further improving the resin flowability.

Figure 3B:
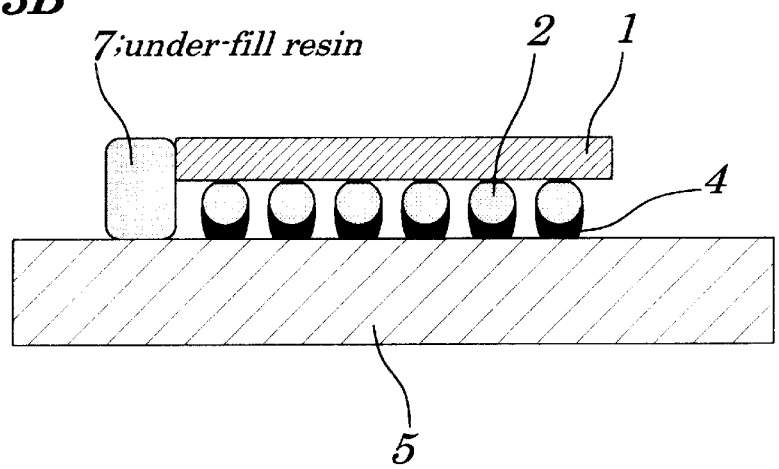

Next, as shown in FIG. 3B, the under-fill resin 7 is coated by a resin-coating device to a surface of one side of the semiconductor chip 1. The under-fill resin 7 used here may be, for example, an epoxy-based resin, a silicone-based resin, a polyimide-based resin, a polyolefine-based resin, a cyanate-ester-based resin, a phenol-based resin, a naphthalene-based resin, a fluorine-based resin, or a like.

Figure 3C:
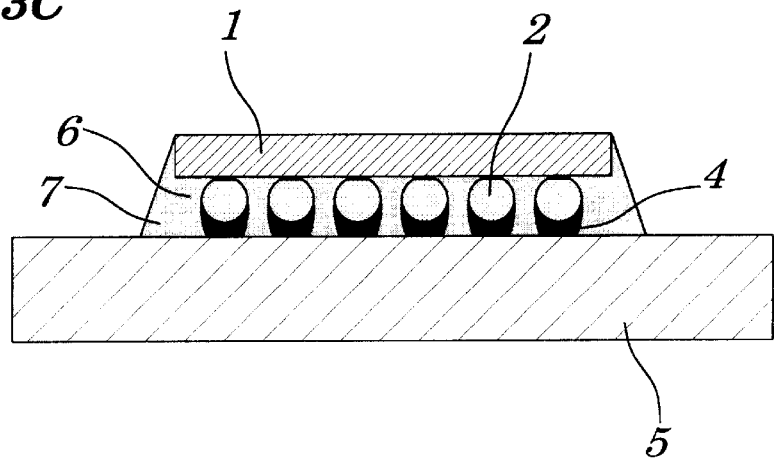

Next, as shown in FIG. 3C, the under-fill resin 7 is injected to the under-fill portion 6. With this, by keeping the wiring board 5 at about 70° C. after the under-fill resin 7 is coated in a previous process, the under-fill resin 7 goes around the under-fill portion 6 by surface tension, thus reaching an opposite side surface. In this case, as mentioned above, the right face of the semiconductor chip 1 and that of the wiring board 5 have been given improved flowability of the resin by oxygen-plasma processing, thus speeding going-around of the under-fill resin 7.

For example, contact angle for the above-mentioned right face could largely be reduced from 90–110 degrees in a case of oxygen-plasma processing not being performed down to 10–20 degrees in a case of oxygen-plasma processing being performed. This reduction in the contact angle is reflected on the flowability of the under-fill resin 7, in such a way that for the semiconductor chip 1 with a 13 mm by 13 mm size, for example, the injection time for the under-fill resin 7 per semiconductor chip could be reduced from four to five minutes in a former case down to two to three minutes in a latter case.

Next, the wiring board 5 with the under-fill resin 7 injected therein undergoes cure processing to harden the under-fill resin 7. This cure processing is conducted in two steps: a first step of storing the wiring board 5, for example, at about 150° C. for about 15 minutes and a subsequent second step of storing it at about 150° C. for about 60 minutes. With this, the under-fill portion 6 is sealed completely with the under-fill resin 7, thereby protecting the semiconductor chip 1 from an outer atmosphere. The above-mentioned processes manufacture a main portion of the semiconductor device.

Figure 4A:
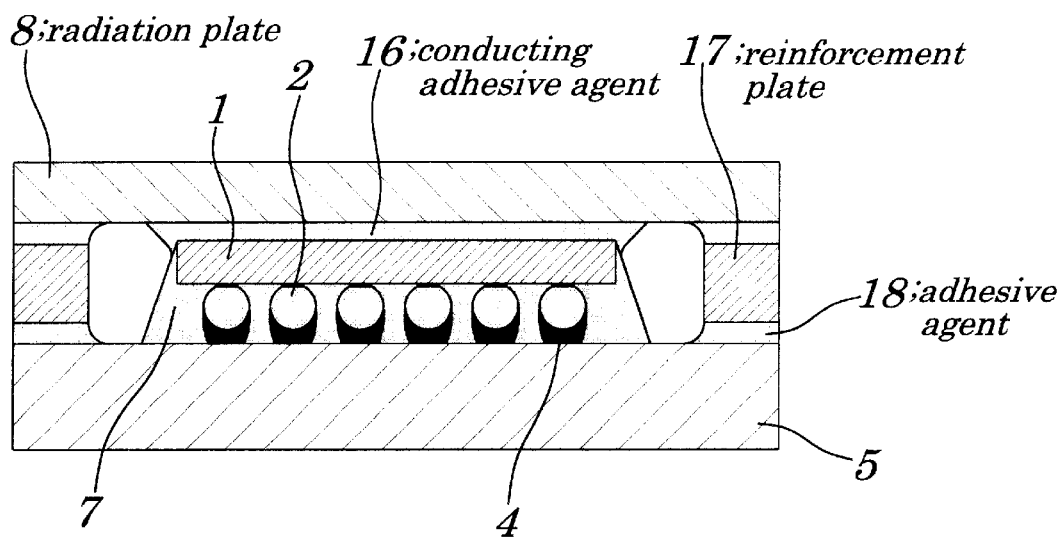
FIGS. 4A to 4B are further another continuing flow diagrams showing the same semiconductor-device manufacturing-method configuration in the order of the steps performed.

Next, as shown in FIG. 4A, on the back face of the semiconductor chip 1 is mounted a radiation plate 8 made of, for example, copper via a conducting adhesive agent 16 such as silver paste. Prior to mounting of this radiation plate 8, a reinforcement plate 17 made of, for example, copper is mounted via an adhesive agent 18 in such a manner as to surround the semiconductor chip 1. This reinforcement plate 17 works also to support the semiconductor chip 1 mechanically while the above-mentioned radiation plate 8 is being mounted.

Figure 4B:
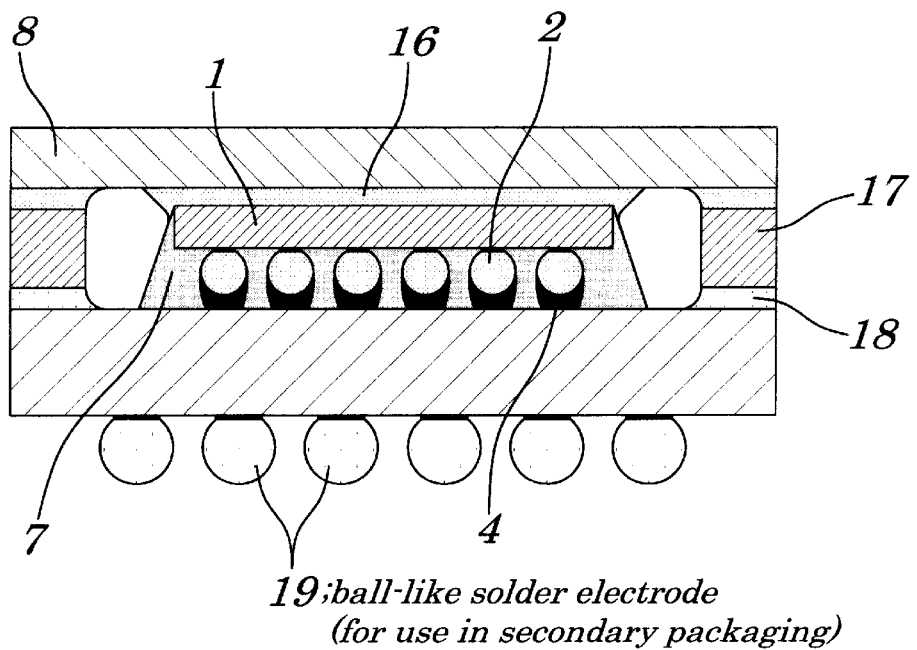

Next, as shown in FIG. 4B, ball-like solder electrodes 19 for use in secondary packaging are connected to the back face of the wiring board 5. These ball-like solder electrodes 19 are connected specifically by locating, for example, bumps of eutectic solder (alloy made of 37% of Pb and 63% of Sn, having a melting point of 183° C.) at prescribed positions on an upward-facing back face of the wiring board 5 mounted thereon with the semiconductor chip 1 which is turned over beforehand. Then, this wiring board 5 is moved into the reflow furnace to be heated up to the melting point or higher than eutectic solder and melted, thus being connected.

In this case, preferably, heating temperature would not exceed the heating temperature of the eutectic solder bumps 4 employed when the semiconductor chip 1 is mounted. The above steps complete the semiconductor device.

Thus, according to a configuration of this embodiment, the semiconductor chip 1 that flux 3 is coated to its right face on which the ball-like solder electrodes 2 are connected is packaged to the wiring board 5, after which a washing solution is forcedly sprayed to the under-fill portion 6 between the semiconductor chip 1 and the wiring board 5, after which the wiring board 5 is exposed to an oxygen-plasma atmosphere for plasma processing, thus making it possible to completely remove the organic film of the flux 3 or a like left after the semiconductor chip 1 is packaged.

Therefore, the flowability of the resin when it is being injected to the under-fill portion 6 can be improved, thus preventing a void from occurring in the under-fill resin 7 during the injection of a resin as well as reducing time required for the resin injection.

Second Embodiment

The configuration of a method for manufacturing semiconductor devices according to a second embodiment of the invention differs largely from that according to the above-mentioned first embodiment in a respect that it uses argon-plasma processing instead of oxygen-plasma processing.

That is, this second embodiment performs argon-plasma processing instead of oxygen-plasma processing conducted in FIG. 3A process of the first embodiment, to roughen a right face of a semiconductor chip 1 and that of a wiring board 5, thus forming minute irregularities therein. In this second embodiment, a contact angle for the right face could be reduced to 30–40 degrees from 90–110 degrees in a case of oxygen-plasma processing not being performed. Therefore, in this embodiment also, an organic film left in a flux wash-off process can be removed completely.

Other processes other than this argon-plasma processing process are almost same as those for the first embodiment. Therefore, they are omitted in description here.

Thus, configuration according to this embodiment also provides almost same effects as those described with the first embodiment.

Third Embodiment

The configuration of a method for manufacturing semiconductor devices according to a third embodiment of the invention largely differs from that according to the above-mentioned first embodiment in a respect that it performs plasma processing by use of a gas mixture of oxygen and argon instead of the above-mentioned oxygen-plasma processing.

That is, this embodiment performs plasma processing by use of a gas mixture of oxygen and argon instead of the above-mentioned oxygen-plasma processing performed in the FIG. 3A process of the first embodiment, to roughen a right face of a semiconductor chip 1 and that of a wiring board 5, thus forming minute irregularities therein. Therefore, this embodiment also makes it possible to completely remove an organic film of a flux left during a flux wash-off process.

Other processes other than this process of argon-plasma processing are almost same as those of the first embodiment. Therefore, they are omitted in description here.

Thus, configuration of this embodiment also can provide almost same effects as those mentioned above with the first embodiment.

Although the embodiments of the invention have been described in detail with reference to drawings, specific configuration is not limited to these embodiments but any variations in designing not departing from a gist of the invention are included in the invention. For example, a high-melting-point solder of ball-like solder electrodes connected to a right face of a semiconductor chip is given just as one example, so that other types of high-melting-point solder may be used which has a different composition and a different configuration. Also, a radiation plate mounted to a back face of the semiconductor chip may be any shape such as a fin as far as it is excellent in radiation of heat.

As mentioned above, according to the method of manufacturing semiconductor devices of the invention, the semiconductor chip is packaged onto a wiring board that flux is coated to its right face onto which ball-like electrodes are connected, after which a washing solution is forcedly sprayed to an under-fill portion between the semiconductor chip and the wiring board, which wiring board is then exposed to an oxygen-plasma atmosphere to undergo plasma processing, thus making it possible to completely remove flux residue after the semiconductor chip is packaged.

Therefore, it is possible to improve flowability of a resin when it is being injected to the under-fill portion, thus preventing a void from occurring in under-fill resin during injection of the resin as well as reducing time required for resin injection.

It is apparent that the present invention is not limited to the above embodiments but may be changed and modified without departing from the scope and spirit of the invention.

Finally, the present application claims the Convention Priority based on Japanese Patent Application No. Hei 11-287752 filed on Oct. 8, 1999, which is herein incorporated by reference.

What is claimed is:

1. A method for manufacturing semiconductor devices for packaging a semiconductor chip onto a wiring board by a flip-chip approach and then injecting a resin into an under-fill portion between said wiring board and said semiconductor chip, said method comprising steps of:

a flux-coating step of preparing said semiconductor chip having a right face with ball-like solder electrodes thereon and then coating flux onto said right face of said semiconductor chip;

a semiconductor-chip packaging step of preparing said wiring board having a right face with eutectic solder bumps thereon;

mounting said semiconductor chip onto said wiring board in such a way that said ball-like solder electrodes are aligned with said eutectic solder bumps and then melting said eutectic solder bumps to package said semiconductor chip onto said wiring board;

a flux wash-off step of forcedly sending a washing solution by using a forced water stream method into a narrow region of said under-fill portion between said semiconductor chip and said wiring board, including a minute region between said ball-like solder electrodes to wash off flux remaining in said under-fill position;

plasma etching to remove any of said flux still remaining in said under-fill portion by exposing said wiring board to a plasma atmosphere portion after said flux wash-off step; and injecting said resin into said under-fill portion.

2. The method for manufacturing semiconductor devices according to claim 1 further comprising the step of, after said under-fill resin-injection process, a packaging ball-like solder electrode-connection step of connecting packaging ball-like solder electrodes onto a back face of said wiring board.

3. The method for manufacturing semiconductor devices according to claim 2, further comprising a step of a radiation-plate mounting process of mounting a radiation plate onto a back face of said semiconductor chip after said under-fill resin-injection process and before said packaging ball-like solder electrode-connection step.

4. The method for manufacturing semiconductor devices according to claim 1, wherein said plasma processing step is performed by performing plasma processing by use of oxygen.

5. The method for manufacturing semiconductor devices according to claim 1, wherein said plasma processing step is performed by performing plasma processing by use of argon.

6. The method for manufacturing semiconductor devices according to claim 1, wherein said plasma processing step is performed by performing plasma processing by use of a gas mixture of oxygen and argon.

7. The method for manufacturing semiconductor device according to claim 1, wherein a melting point of said ball-like solder electrodes of said semiconductor chip is higher than a melting point of said eutectic solder bumps of said wiring board.

8. The method for manufacturing semiconductor devices according to claim 1, wherein said ball-like solder electrodes of said semiconductor ship are made of solder having a high melting point.

9. The method for manufacturing semiconductor devices according to claim 7, wherein said ball-like solder electrodes of said semiconductor chip are made of solder having a high melting point.

10. The method for manufacturing semiconductor devices according to claim 2, wherein said packaging ball-like solder electrodes of said wiring board are made of eutectic solder.

11. The method for manufacturing semiconductor devices according to claim 1, wherein a region where said ball-like solder electrodes are not connected onto said right face of said semiconductor ship is covered with an insulator protection film.

12. The method for manufacturing semiconductor devices according to claim 1, wherein a region where said eutectic solder bumps are not formed on said right face of said wiring board is covered with an insulator protection film.

13. The method for manufacturing semiconductor devices according to claim 1, wherein said wiring board consists of a multi-layer wiring board.

* * * * *